(12) United States Patent
Donohoe et al.

(10) Patent No.: US 6,184,146 B1
(45) Date of Patent: Feb. 6, 2001

(54) PLASMA PRODUCING TOOLS, DUAL-SOURCE PLASMA ETCHERS, DUAL-SOURCE PLASMA ETCHING METHODS, AND METHOD OF FORMING PLANAR COIL DUAL-SOURCE PLASMA ETCHERS

(75) Inventors: Kevin G. Donohoe; Guy T. Blalock, both of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/598,589

(22) Filed: Jun. 20, 2000

Related U.S. Application Data

(63) Continuation of application No. 09/435,237, filed on Nov. 5, 1999, now Pat. No. 6,114,252, which is a continuation of application No. 09/141,810, filed on Aug. 28, 1998, now Pat. No. 6,074,953.

(51) Int. Cl.[7] .................................................. H01L 21/00
(52) U.S. Cl. ........................ 438/710; 156/345; 438/729; 438/735
(58) Field of Search ................................ 156/345, 345 P, 156/345 C; 216/67, 68, 80; 438/710, 719, 729, 735

(56) References Cited

U.S. PATENT DOCUMENTS

| | | |
|---|---|---|
| 4,595,452 | 6/1986 | Landau et al. . |
| 4,948,458 | 8/1990 | Ogle . |
| 5,277,751 | 1/1994 | Ogle . |
| 5,304,279 | 4/1994 | Coultas et al. . |
| 5,366,585 | 11/1994 | Robertson et al. . |
| 5,368,646 | 11/1994 | Yasuda et al. . |
| 5,432,315 | 7/1995 | Kaji et al. . |
| 5,460,707 | * 10/1995 | Wellerdieck ...................... 156/345 X |
| 5,552,124 | 9/1996 | Su .................................... 156/345 P |
| 5,589,737 | 12/1996 | Barnes et al. . |
| 5,605,637 | 2/1997 | Shan et al. . |
| 5,643,394 | 7/1997 | Maydan et al. . |
| 5,656,123 | 8/1997 | Salimian et al. ................... 156/345 P |
| 5,688,357 | 11/1997 | Hanawa . |
| 5,900,064 | 5/1999 | Kholodenko . |

FOREIGN PATENT DOCUMENTS

| | | |
|---|---|---|
| 0 641 013 A2 | 3/1995 | (EP) . |
| 0 814 495 A2 | 12/1997 | (EP) . |
| 0 886 298 A2 | 12/1998 | (EP) . |
| WO 98/14980 | 4/1998 | (WO) . |

OTHER PUBLICATIONS

No author; "Etch Products—TCP 9100 High–Density Oxide Etch System"; undated; 1 page.

No author; "TCP 9100 Oxide Etcher"; undated; 7 pages.

\* cited by examiner

*Primary Examiner*—William Powell
(74) *Attorney, Agent, or Firm*—Wells, St. John, Roberts, Gregory & Matking P.S.

(57) ABSTRACT

Plasma processing tools, dual-source plasma etchers, and etching methods are described. In one embodiment, a processing chamber is provided having an interior base and an interior sidewall joined with the base. A generally planar inductive source is mounted proximate the chamber. A dielectric liner is disposed within the chamber over the interior sidewall with the liner being received over less than an entirety of the interior sidewall. In a preferred embodiment, the interior sidewall has a groundable portion and the dielectric liner has a passageway positioned to expose the groundable interior sidewall portion. Subsequently, a plasma developed within the chamber is disposed along a grounding path which extends to the exposed interior sidewall. In another preferred embodiment, the dielectric liner is removably mounted within the processing chamber.

76 Claims, 7 Drawing Sheets

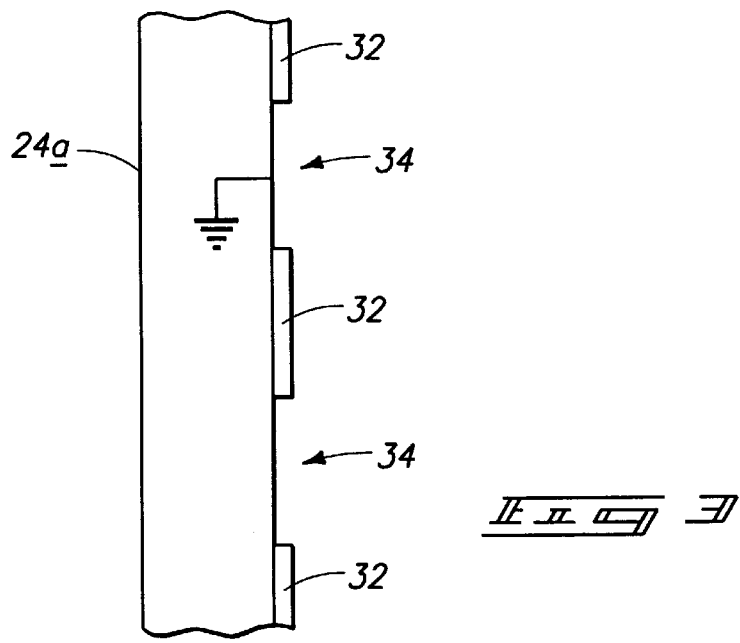
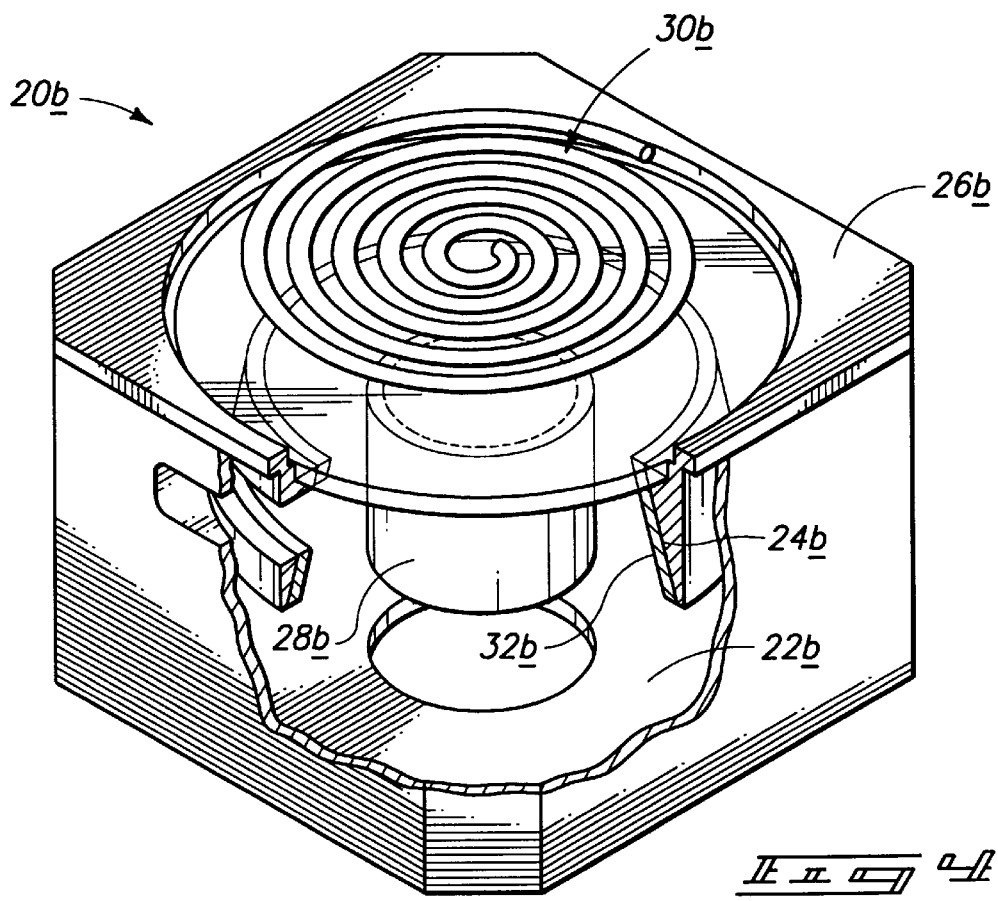

PLASMA PRODUCING TOOLS, DUAL-SOURCE PLASMA ETCHERS, DUAL-SOURCE PLASMA ETCHING METHODS, AND METHOD OF FORMING PLANAR COIL DUAL-SOURCE PLASMA ETCHERS

CROSS REFERENCE TO RELATED APPLICATION

This is a Continuation of U.S. patent application Ser. No. 09/435,237, filed Nov. 5, 1999, now U.S. Pat. No. 6,114,252, and titled "Plasma Producing Tools, Dual-Source Plasma Etchers, Dual-Source Plasma Etching Methods, and Methods of Forming Planar Coil Dual-Source Plasma Etchers", which is a Continuation of U.S. patent application Ser. No. 09/141,810, filed Aug. 28, 1998, now U.S. Pat. No. 6,074,953.

TECHNICAL FIELD

The invention pertains to plasma processing tools, dual-source plasma etchers, dual-source plasma etching methods, and methods of forming planar coil dual-source plasma etchers.

BACKGROUND OF THE INVENTION

Semiconductor processing typically involves depositing one or more layers of material and subsequently etching such layers to form a substrate feature. It is highly desirable to form uniform features over the entire surface of a semiconductor wafer. Yet, non-uniformities can arise based on the location of the feature relative to the wafer. For example, one type of semiconductor feature is a contact opening. Contact openings are typically etched through a dielectric material such as borophosphosilicate glass (BPSG). It has been observed that contact openings formed at or near the center of a wafer can have a different profile from contact openings formed away from the center of a wafer, e.g. at or near the wafer's periphery. Such non-uniformities are undesirable as they impart a degree of unpredictability in the finished integrated circuit.

This invention arose out of concerns associated with improving the uniformity with which substrate features, and in particular contact openings, are formed over a wafer. In particular, this invention arose out of concerns associated with improving dual-source plasma etchers and methods of using the same.

SUMMARY OF THE INVENTION

Plasma processing tools, dual-source plasma etchers, and etching methods are described. In one embodiment, a processing chamber is provided having an interior base and an interior sidewall joined with the base. A generally planar inductive source is mounted proximate the chamber. A dielectric liner is disposed within the chamber over the interior sidewall with the liner being received over less than an entirety of the interior sidewall. In a preferred embodiment, the interior sidewall has a groundable portion and the dielectric liner has a passageway positioned to expose the groundable interior sidewall portion. Subsequently, a plasma developed within the chamber is disposed along a grounding path which extends to the exposed interior sidewall. In another preferred embodiment, the dielectric liner is removably mounted within the processing chamber.

BRIEF DESCRIPTION OF THE DRAWINGS

Preferred embodiments of the invention are described below with reference to the following accompanying drawings.

FIG. 3 is a view of the FIG. 2 sidewall at a processing step which is different from that which is shown in FIG. 2.

FIG. 4 is a perspective view of a portion of a dual-source plasma etcher in accordance with one embodiment of the invention, with a portion broken away for clarity.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
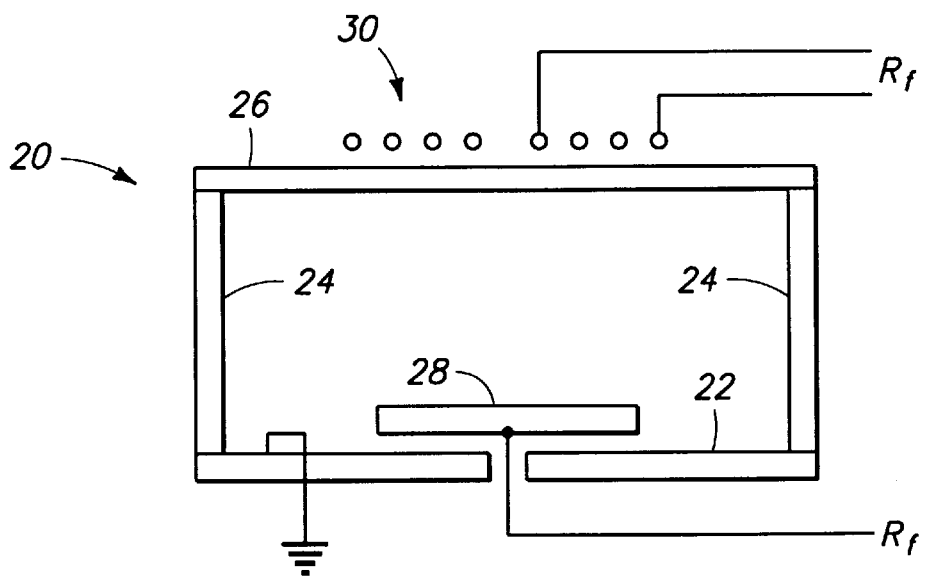
FIG. 1 is a schematic view of a plasma processing tool in the form of a dual-source plasma etcher in accordance with the prior art.

Referring to FIG. 1, a known processing chamber is shown generally at 20 and comprises a plasma processing tool which, in one embodiment can function as a dual-source plasma etcher, and in another embodiment can function as a deposition tool under RF bias conditions. Chamber 20 includes an interior base 22, a sidewall 24 joined with interior base 22, and a top 26. A wafer support 28 is provided and is configured to support a semiconductor wafer during processing within the chamber. An inductive source 30 is provided, generally in the form of a planar inductive coil which is mounted proximate or over chamber 20. Typically, top 26 will include a dielectric window proximate coil 30 to facilitate inductive coupling with a plasma developed within the chamber. Inductive source 30 is typically powered by an RF power source, and wafer support 28 is typically powered by another power source such as a DC, AC or RF power source. Accordingly, processing chamber 20 is configured into a dual-source, plasma etching configuration. During operation, a portion of an interior surface of the chamber can be grounded. Dual-source plasma etchers and the operation thereof are described in a text entitled *Principles of Plasma Discharges and Materials Processing*, authored by Lieberman and Lichtenberg.

One problem which has arisen with chambers such as the FIG. 1 chamber, concerns non-uniformity in etching as described in the "Background of the Invention" section above. One source of the problem is believed to be associated with different voltages which can be present within a plasma during etching. Specifically, when a plasma is developed within chamber 20, the plasma can be, at different locations within the chamber, subjected to different voltages. These different voltages are believed to cause non-uniformity in etching across the surface of a wafer because of the impact the voltages have on plasma constituents. Further, in some etch processing, it is desired to ground a portion of wafer support 28. Thus, grounding lines which are established between a wafer supported by wafer support 28 and the ground have different lengths. For example, grounding lines originating from the periphery of the wafer are generally shorter than grounding lines which originate at or near the center of the wafer. The grounding line length is believed to have an adverse impact on etch uniformity across the wafer.

Another problem associated with chambers such as the FIG. 1 chamber are that internal chamber components can be undesirably etched during wafer etching. Specifically, some chambers can include components such as chamber wall heaters and the like. As a result of the undesirable etching, component lifetimes can be reduced thereby requiring more frequent replacement and increasing the cost of maintaining the processing chamber.

Figure 2:
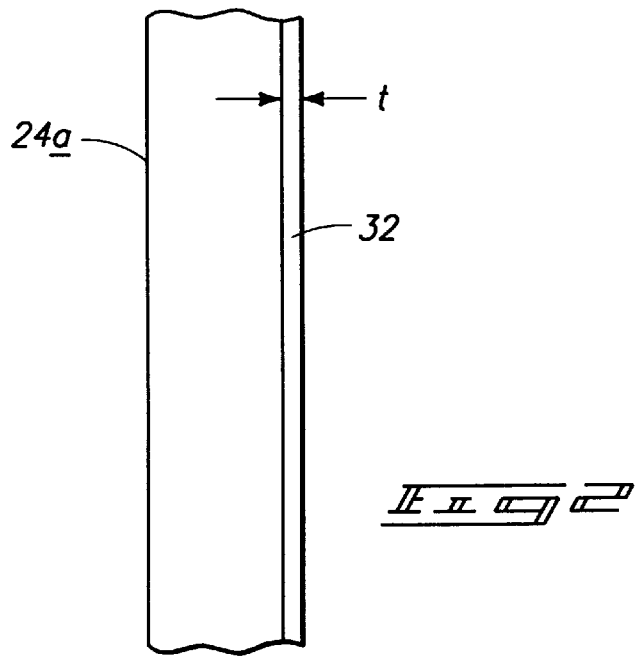
FIG. 2 is a side sectional view of a portion of a sidewall of a dual-source plasma etcher in accordance with one embodiment of the invention.

Referring to FIG. 2, a portion of a processing chamber sidewall in accordance with one embodiment of the invention is shown generally at 24a. Like numerals from the above-described embodiment have been utilized where appropriate, with differences being indicated by the suffix "a".

A dielectric liner 32 is provided within chamber 20 and covers at least a portion of interior sidewall 24a. Sidewall 24a is preferably configured to be grounded during plasma etching operations as will become apparent below. In a preferred embodiment, dielectric liner 32 comprises an anodized layer of material, formed through conventional anodization techniques. An exemplary dielectric material is $Al_2O_3$. Preferably, anodized layer 32 is formed to have a thickness t of no less than about 5 mils, and is received over less than an entirety of interior sidewall 24a. Such is more apparent in FIG. 3 where passageways 34 are shown to expose a portion of interior sidewall 24a. The passageways are preferably positioned to expose one or more groundable portions of sidewall 24a. During operation, passageways 34 provide a grounding path to the grounded sidewall portions for plasma which is generated within the chamber.

Layer 32 can be provided or formed over sidewall 24a in any suitable way. In one aspect, layer 32 is first formed over the interior sidewall to define a dielectric liner body. Thereafter, portions of the dielectric liner body are removed sufficiently to provide a plurality of passageways 34. In a most preferred embodiment, passageways 34 are provided or formed to extend through and be surrounded or enclosed by material of the dielectric liner body. Accordingly, such passageways form a plurality of holes or openings received by the dielectric liner proximate the groundable portion of the interior sidewall. In another preferred embodiment, passageways or openings 34 are provided such that the dielectric liner or liner body is disposed over greater than about 10% of the surface area of interior sidewall 24a.

In another preferred embodiment, grounding paths are determined and appropriate grounding points are selected. Material is then selected for the groundable portion of the interior sidewall. Selection of the material for the groundable interior sidewall portion can be tailored to reduce formation of non-volatile byproducts. In this manner, openings in the dielectric liner or cover can outwardly expose the material comprising the groundable sidewall portion(s). Exemplary materials of choice for the groundable sidewall portion are silicon carbide or silicon to reduce formation of undesirable byproducts. Materials can also be selected to react with the various etch chemistries to form volatile products.

Referring to FIG. 4, another processing chamber embodiment is set forth. There, a portion of a dual-source plasma etcher includes a processing chamber 20b. Like numerals from the above-described embodiment have been utilized where appropriate, with differences being indicated by the suffix "b". The illustrated etcher is the TCP 9100 high-density oxide etch system, which is available through Lam Research Corporation of Fremont, Calif. A portion of chamber 20b has been broken away to show a dielectric liner or cover 32b which is disposed over the entirety of interior sidewall 24b. Such configuration has led to some of the above-described etch non-uniformities which are addressed and improved upon by certain aspects of the invention.

Figure 5:
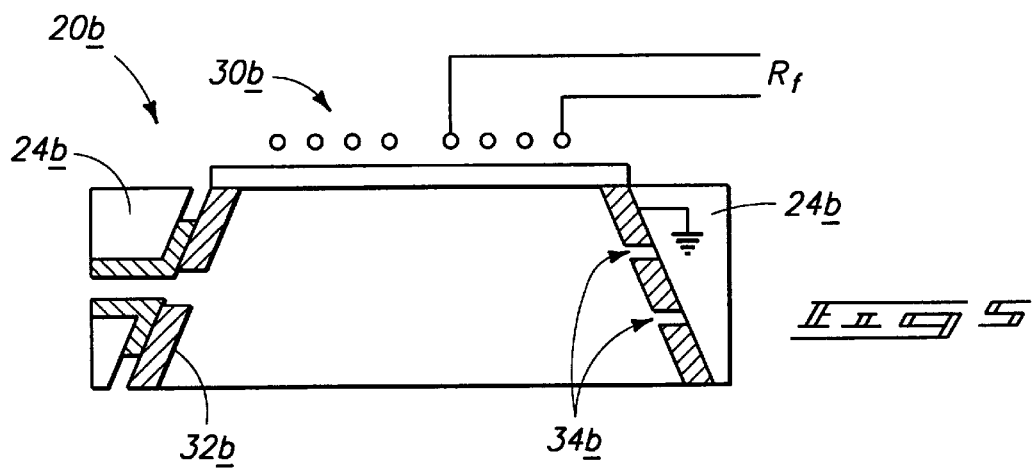
FIG. 5 is a schematic view of a portion of the FIG. 4 etcher.
Figure 10:
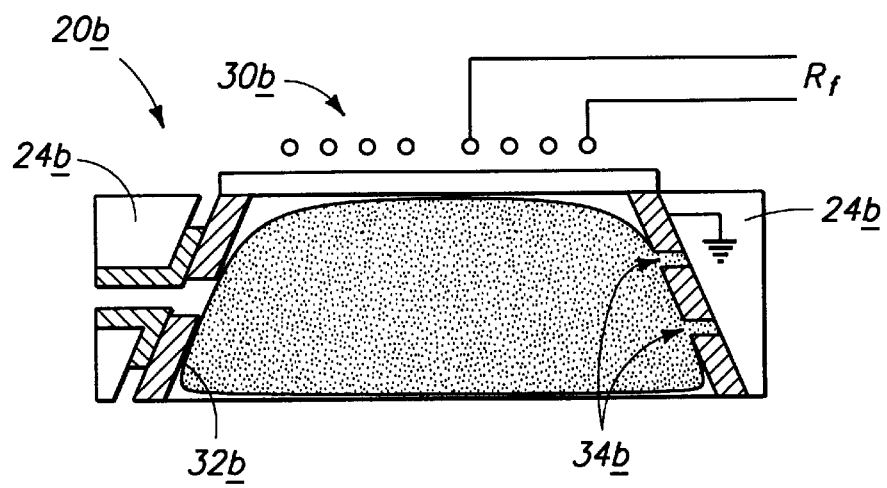
FIG. 10 is a view of the FIG. 5 etcher, and depicts a plasma which is developed therein, in accordance with one embodiment of the invention.

Referring to FIG. 5, a plurality of passageways or openings 34b are formed or otherwise provided within dielectric liner body 32b. Such openings are positioned to preferably expose a gas plasma developed therewithin to groundable portions of interior sidewall 24b. Doing so has been observed to improve etch uniformity across a wafer. Such is illustrated in FIG. 10 where a portion of a gas plasma, indicated by the stippled shading, is seen to electrically contact a grounded portion of sidewall 24b.

Figure 6:
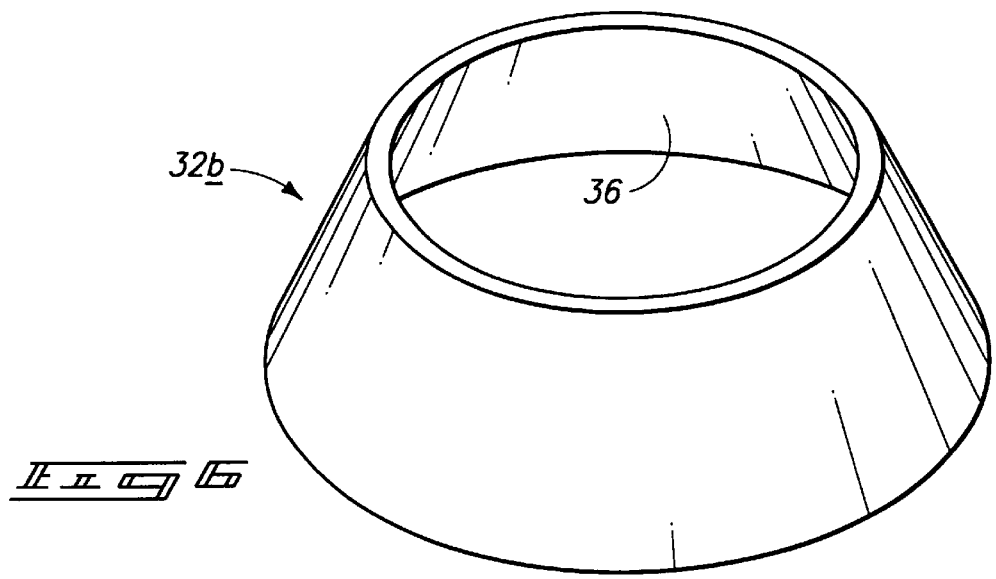
FIG. 6 is a perspective view of a dielectric liner suitable for use in the FIG. 4 etcher.
Figure 7:
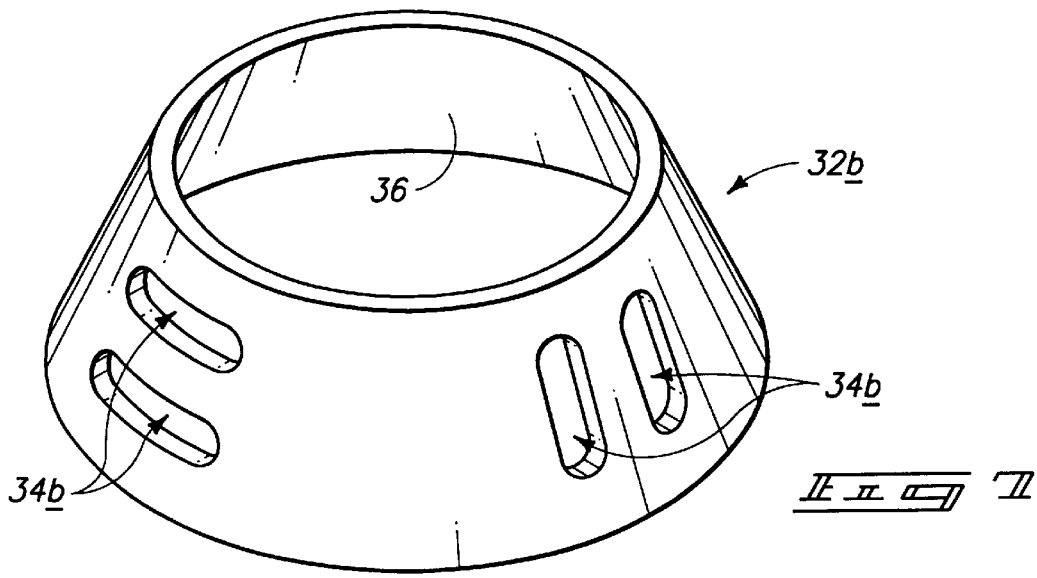
FIG. 7 is a view of the FIG. 6 dielectric liner having been processed in accordance with one aspect of the invention.

Referring to FIG. 6, and in accordance with one aspect of the invention, dielectric liner body 32b is removably mountable within chamber 20b and comprises a generally frustum-shaped interior surface 36. The liner body is preferably formed, in this example, away from chamber 20 and separately provided with passageways 34b as shown in FIG. 7. To form the passageways, portions of liner body 32b are removed. In this example, passageways 34b comprise a plurality of holes which extend through liner body 32b and have a generally elongated shape in a direction generally parallel with interior surface 36. Passageways or holes 34b can, however, have any desired shape, number, and/or orientation.

Figure 8:
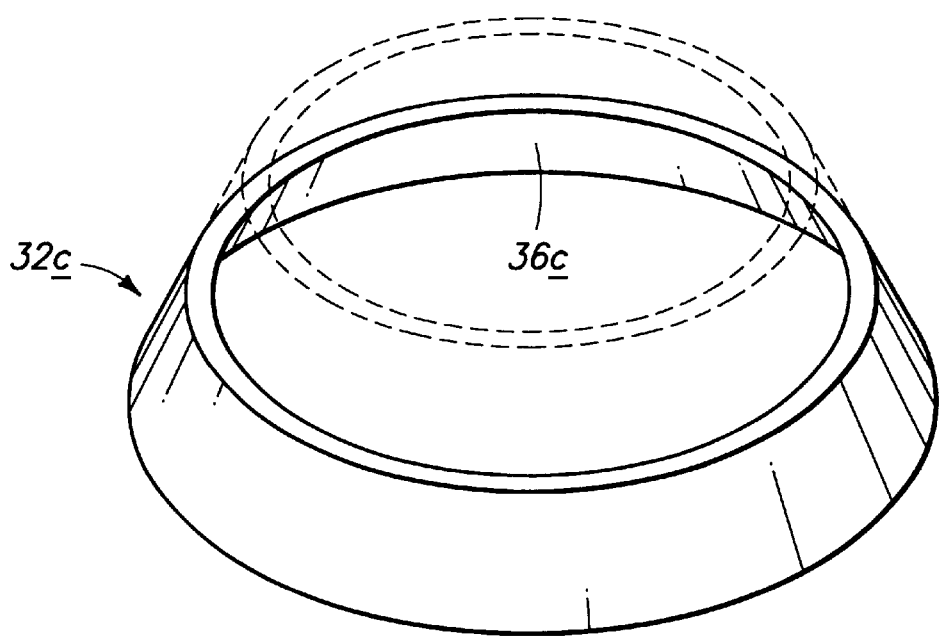
FIG. 8 is a view of a dielectric liner in accordance with an alternate embodiment of the present invention.
Figure 9:
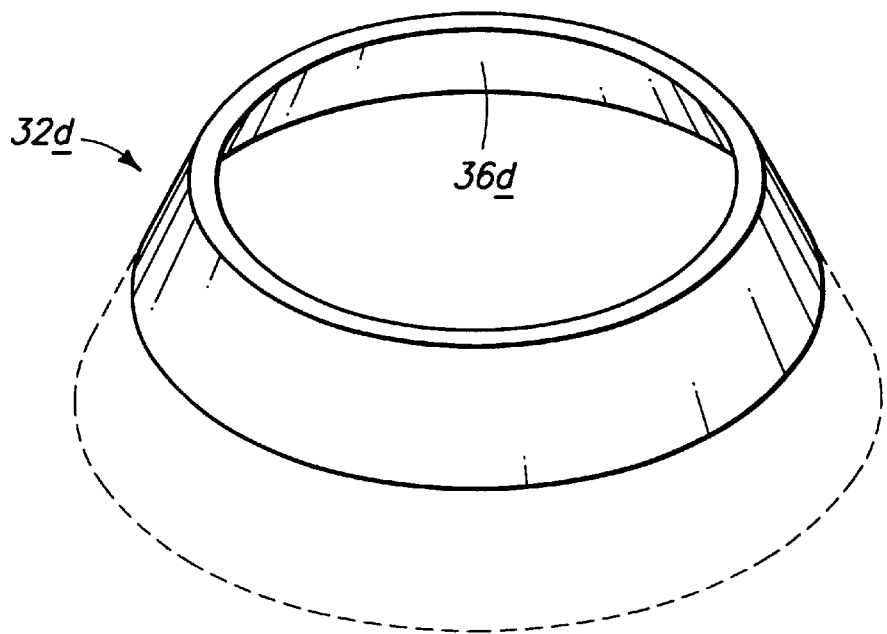
FIG. 9 is a view of a dielectric liner in accordance with an alternate embodiment of the present invention.

Referring to FIGS. 8 and 9, two different dielectric liner bodies, in accordance with alternate embodiments of the invention, are shown generally at 32c and 32d respectively. Like numerals from the above-described embodiment have been utilized where appropriate with differences being indicated by the suffixes "c" and "d", respectively.

Dielectric liner body 32c (FIG. 8) is configured to be mounted over at least a bottommost portion of interior sidewall 24b (FIG. 4). Accordingly, a grounding path would be provided by a passageway which is disposed over or above dielectric liner body 32c when mounted in processing chamber 20b (FIG. 4). In this example, the passageway defining the grounding path is neither surrounded by nor enclosed by dielectric liner material.

Dielectric liner body 32d (FIG. 9) is configured to be mounted over at least an uppermost portion of interior sidewall 24b (FIG. 4). Accordingly, a grounding path would be provided by a passageway which is disposed below or under dielectric liner body 32d when mounted in processing chamber 20b (FIG. 4). In this example, the passageway defining the grounding path is neither surrounded by nor enclosed by dielectric liner material.

Figure 14:
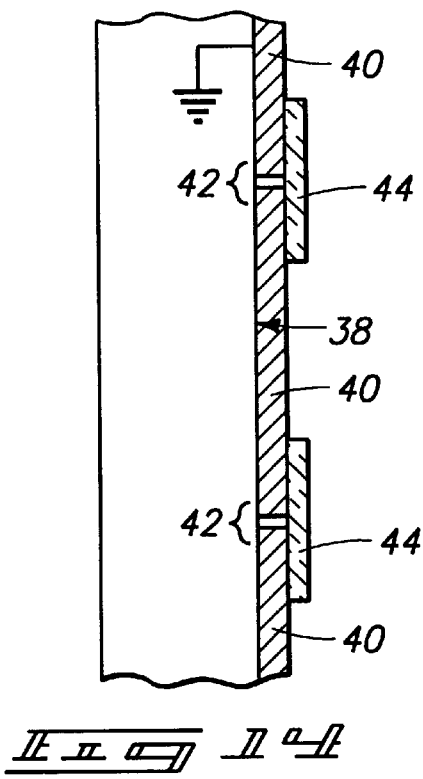
FIG. 14 is a side sectional view of a portion of a sidewall of a dual-source plasma etcher in accordance with one embodiment of the invention.
Figure 15:
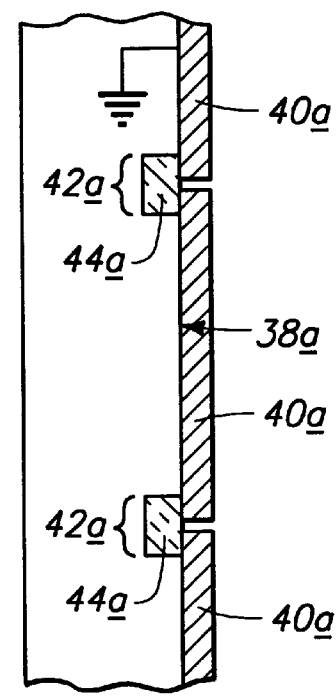
FIG. 15 is a side sectional view of a portion of a sidewall of a dual-source plasma etcher in accordance with another embodiment of the invention.

Referring to FIGS. 14 and 15, two alternate exemplary embodiments are shown. These embodiments can provide plasma processing tools having chambers which can be specifically engineered to achieve desired grounding paths for the plasma as described above, and which are formed from material which can be selected to reduce, or eliminate undesirable formation of non-volatile by-products. In addition, the various described tool embodiments can be less expensive to build and maintain than currently available tools.

Preliminarily, by determining the location or locations of the grounding paths or points, one can take measures to ensure that grounding takes place through these paths or points. Materials can then be selected for the grounding surfaces which are selected to reduce formation of non-volatile by-products.

FIGS. 14 and 15 show portions of an interior groundable chamber surface at 38, 38a respectively. Surfaces 38, 38a are configured for grounding during operation of the processing tool of which they are a part. Each surface generally has a surface area. In one embodiment, at least one grounding electrode 40, 40a respectively, is disposed over and in operative contact with surface 38, 38a respectively. More preferably, a plurality of grounding electrodes are provided and discretely positioned over surfaces 38, 38a respectively. Preferably, during operation of the processing tool, a grounding path is established through one or more of the electrodes. The illustrated and preferred grounding electrodes cover less than an entirety of the surface area of surfaces 38, 38a. For example, each illustrated grounding electrode 40, 40a has a small gap between it and a next adjacent grounding electrode. Each gap potentially leaves a portion surface 38, 38a, e.g. surface portions 42, 42a respectively, exposed. A dielectric covering 44, 44a is provided and disposed over the remaining portions of surface 38, 38a, i.e. portions 42, 42a. Preferably, a plurality of dielectric coverings are provided and discretely positioned over the surface area. The dielectric covering ensures that the risk of exposure of surfaces 38, 38a to the processing environment inside of the chamber is reduced, thereby avoiding corrosion and the like.

In a preferred embodiment, one of the grounding electrode and the dielectric covering overlaps the other of the grounding electrode and the dielectric covering. For example, in FIG. 14, portions of dielectric coverings 44 overlap with their associated grounding electrodes 40. Here, the grounding electrodes are simply mounted on or over surface 38, with dielectric coverings 44 being mounted on or over electrodes 40. In FIG. 15, portions of grounding electrodes 40a overlap with their associated dielectric coverings. Here, portions of surface 38a can be removed to form slots within which dielectric material can be deposited.

Exemplary materials for grounding electrodes 40, 40a include silicon carbide or silicon. Other materials can be utilized, and can be specifically selected to reduce the possibilities of undesirable reactions with chamber reactants during processing. One advantage provided by these embodiments are that certain materials of choice for the grounding electrodes are much less expensive, and are more easily produced when they are produced in smaller pieces. In this way, and in some applications, a grounding electrode "mosaic" can be assembled from the individual discrete grounding electrodes.

Alternately considered, a grounding node is provided and disposed over and in operative contact with surfaces 38, 38a respectively. Respective plasma grounding paths can be established during operation through the grounding nodes. Exemplary grounding node portions are respectively provided by electrodes 40, 40a in FIGS. 14 and 15. The illustrated grounding nodes each have at least one, and more likely a plurality of openings over a portion of the surface area of surfaces 38, 38a respectively. Exemplary surface area portions are shown at 42, 42a respectively. Preferably, at least one dielectric covering, and more likely a plurality of dielectric coverings are disposed over surface area portions 42, 42a. The dielectric coverings are preferably discretely positioned over surfaces 38, 38a. In one embodiment (FIG. 14), a portion of at least one grounding node is disposed intermediate the dielectric covering and groundable surface 38. In this example, a region of overlap is defined between each dielectric covering 44 and its associated intermediately-disposed grounding node portion. In another embodiment (FIG. 15), dielectric coverings 44a are received within the interior conductive groundable surface 38a. In another embodiment (FIG. 15), the grounding node comprises grounding node portions which are received over both the groundable surface 38a and the dielectric covering 44a.

The percentage of surface area coverage of the dielectric covering can be quite small as compared with the overall surface area available, or, the surface area covered by electrodes 40, 40a respectively. For is example, surface area percentages as small as 0.01% can be covered by the dielectric material.

Figure 11:
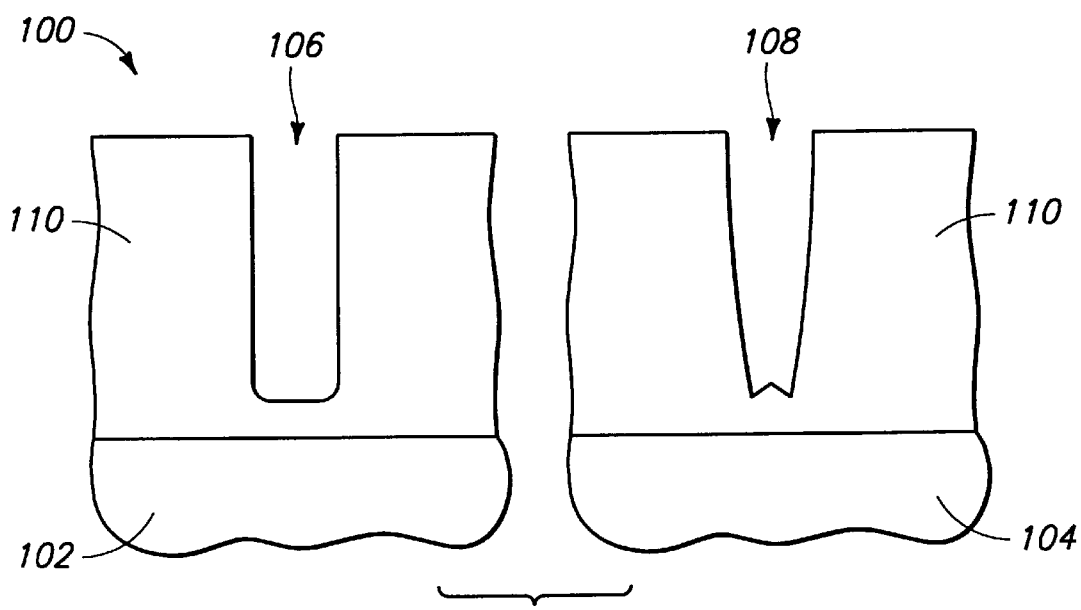
FIG. 11 is a view of a pair of etched features which are spaced apart over a semiconductor wafer in accordance with prior art methods.

Referring to FIG. 11, two portions of a semiconductive wafer 100 are shown generally at 102, 104 and constitute portions of the same wafer which are spaced apart over the wafer body in accordance with the prior art. For example, portion 102 constitutes a portion at or near the edge of a wafer, while portion 104 constitutes a portion at or near the center of the wafer. Utilizing the above-described TCP 9100 high-density oxide etch system with an unmodified dielectric liner body, i.e. one that covers an entirety of the chamber's sidewall, a pair of substrate features 106, 108 were etched through an oxide layer 110. As can be observed, such features are non-uniform in taper, appearance, and configuration. Such is undesirable for all of the reasons mentioned above.

Figure 12:
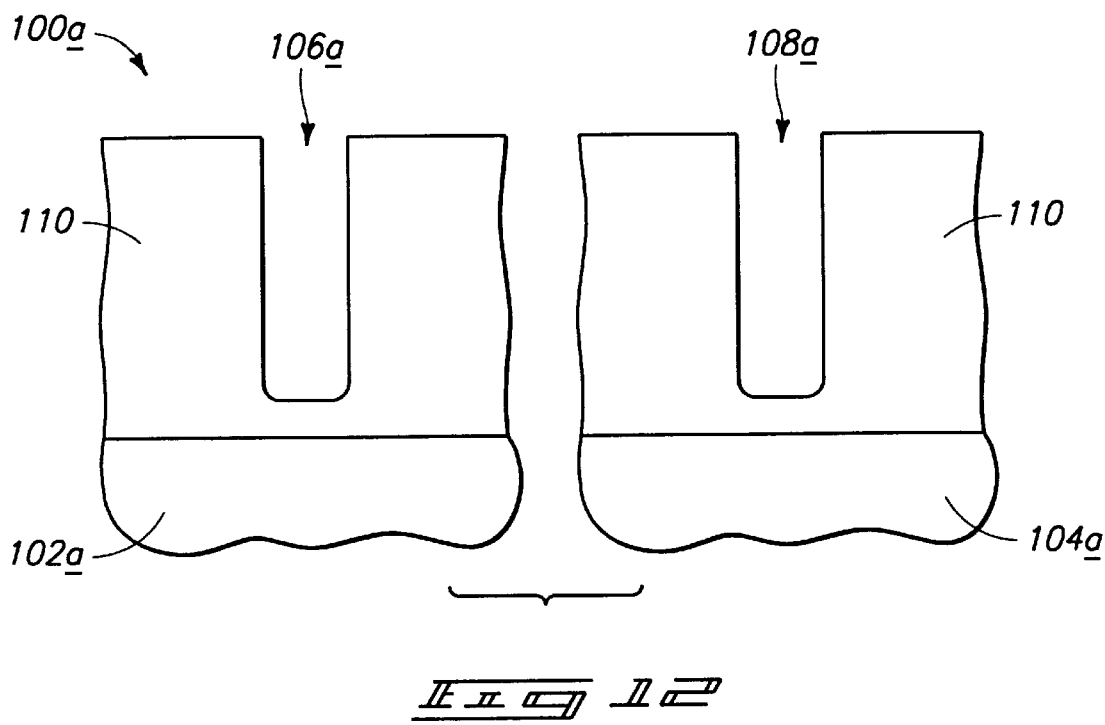
FIG. 12 is a view of a pair of etched features which are spaced apart over a semiconductor wafer in accordance with one aspect of the invention.
Figure 13:
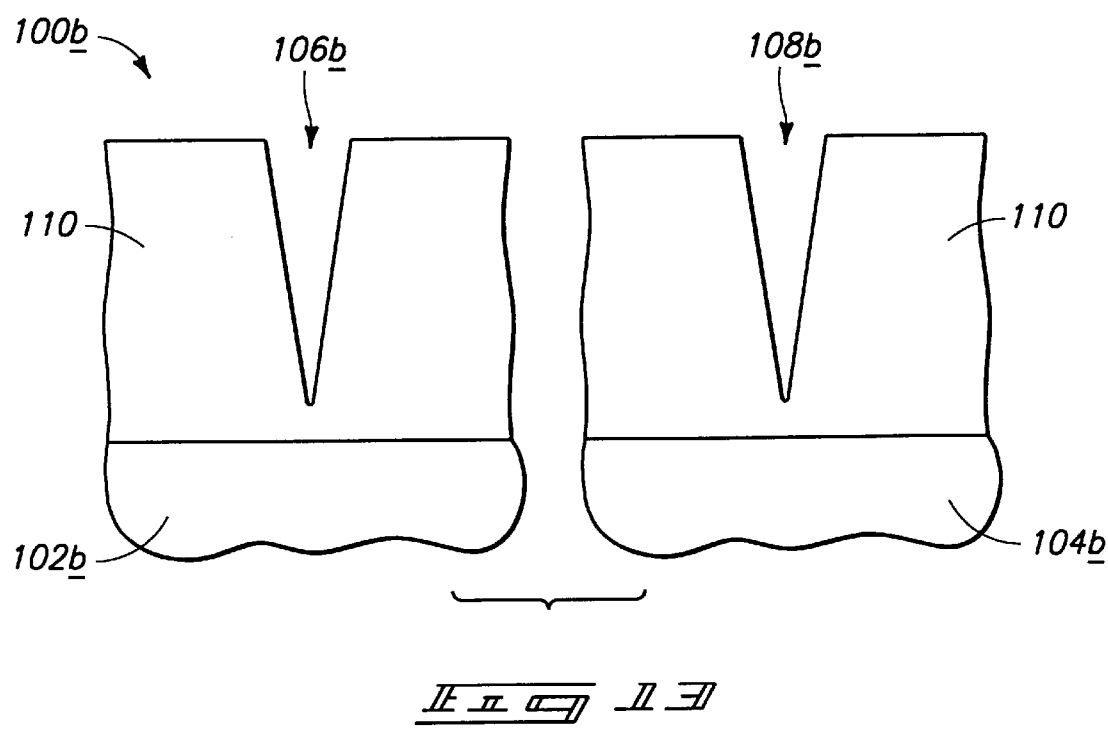
FIG. 13 is a view of another pair of etched features which are spaced apart over a semiconductor wafer in accordance with one aspect of the invention.

Referring to FIGS. 12 and 13, a pair of similarly spaced-apart substrate features 106a, 108a, and 106b, 108b, respectively, are shown. Such constitute features which were etched using the above-described TCP 9100 high-density oxide etch system with a modified dielectric liner body, i.e. one that covers less than an entirety of the chamber's sidewall. Features were etched near the edge of a wafer (106a, 106b), and near the center of the wafer (108a, 108b). Such features are generally uniform in taper, appearance, and configuration. By providing a grounding path for a gas plasma along one or more passageways as described above, etch non-uniformities can be reduced, if not eliminated, thereby increasing the quality of resultant semiconductor devices. In addition, advantages are gained in that internal chamber components can be protected by a dielectric liner or cover, while rendering desirable etch uniformities. And, while the invention has been described in the context of providing enhanced etch uniformities, uniformities in depositions can also be attained utilizing the inventive plasma processing tools and methods described above. More specifically, depositions conducted under RF bias conditions can have increased uniformities.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A dual source plasma processing tool comprising:
   a chamber having an interior base and a conductive interior sidewall;
   a first source of RF energy mounted proximate the chamber and electrically coupled to an interior of the chamber; and
   a dielectric liner disposed within the chamber over only a portion of the interior sidewall.

2. The plasma processing tool of claim 1, wherein the first source is mounted over the chamber.

3. The plasma processing tool of claim 1, wherein the interior sidewall has a groundable portion, and the dielectric liner has a passageway positioned to expose the interior sidewall's groundable portion to a plasma developed within the chamber.

4. The plasma processing tool of claim 1, wherein the interior sidewall has a groundable portion, and the dielectric liner has a plurality of passageways therethrough positioned to expose the interior sidewall's groundable portion to a plasma developed within the chamber.

5. The plasma processing tool of claim 4, wherein one of the passageways is defined by material of the dielectric liner which encloses the one passageway.

6. The plasma processing tool of claim 1, wherein the dielectric liner is mounted over at least an uppermost portion of the interior sidewall.

7. The plasma processing tool of claim 1, wherein the dielectric liner is mounted over at least a bottommost portion of the interior sidewall.

8. The plasma processing tool of claim 1, wherein the dielectric liner comprises an anodized layer of material.

9. The plasma processing tool of claim 8, wherein the anodized layer of material has a thickness over the interior sidewall of no less than about 5 mils.

10. The plasma processing tool of claim 1, wherein the dielectric liner has a thickness over the interior sidewall of no less than about 5 mils.

11. The plasma processing tool of claim 1, wherein the tool is configured as a dual source plasma etcher.

12. A dual-source plasma etcher comprising:
    a chamber having an interior base and a conductive interior sidewall, at least a portion of the interior sidewall being groundable;
    a first RF power source mounted proximate the chamber and electrically coupled to an interior of the chamber;
    a dielectric covering disposed over the interior sidewall of the chamber; and
    an opening received by the dielectric covering and extending therethrough proximate the groundable portion of the interior sidewall, said opening exposing said interior sidewall groundable portion.

13. The dual-source plasma etcher of claim 12, wherein the dielectric covering comprises a plurality of openings received therein and extending therethrough proximate the groundable portion of the interior sidewall.

14. The dual-source plasma etcher of claim 12, wherein the dielectric covering comprises a generally frustum-shaped interior surface.

15. The dual-source plasma etcher of claim 12, wherein the dielectric covering comprises a generally frustum-shaped interior surface, and a plurality of openings received by the covering and extending therethrough proximate the groundable portion of the interior sidewall.

16. The dual-source plasma etcher of claim 12, wherein the dielectric covering is removably mounted within the chamber.

17. The dual-source plasma etcher of claim 12, wherein:
    the dielectric covering comprises a generally frustum-shaped interior surface; and
    the dielectric covering is removably mounted within the chamber.

18. The dual-source plasma etcher of claim 12, wherein the dielectric covering comprises a generally frustum-shaped interior surface and includes a plurality of openings received by the covering and extending therethrough proximate the groundable portion of the interior sidewall, the dielectric covering being removably mounted within the chamber and having a thickness no less than about 5 mils.

19. A dual-source plasma etcher comprising:
    a chamber having an interior base and a conductive interior sidewall;
    a first RF power source mounted proximate the chamber and electrically coupled to an interior of the chamber;
    a dielectric liner disposed over the interior sidewall; and
    a grounding path for plasma generated within the chamber, the grounding path extending through an opening in the dielectric liner to proximate an exposed portion of the interior sidewall.

20. The dual-source plasma etcher of claim 19, wherein the dielectric liner has a thickness of no less than about 5 mils.

21. The dual-source plasma etcher of claim 19, wherein the dielectric liner comprises an anodized layer of material having a thickness of no less than about 5 mils.

22. The dual-source plasma etcher of claim 19, wherein the dielectric liner comprises an anodized layer of material having a thickness of no less than about 5 mils, the layer of material comprising $Al_2O_3$.

23. The dual-source plasma etcher of claim 19, wherein the dielectric liner comprises a plurality of openings therein, and has a thickness of no less than about 5 mils.

24. The dual-source plasma etcher of claim 19, wherein the opening is generally elongate in a direction generally parallel with an interior surface of the dielectric liner.

25. The dual-source plasma etcher of claim 19, wherein the dielectric liner is disposed over greater than about 10% of the surface area of the interior sidewall.

26. A dual source plasma processing tool comprising:
    a chamber having a surface area;
    at least one grounding electrode covering less than an entirety of the surface area; and
    a dielectric covering disposed over a remaining portion of the surface area.

27. The dual source plasma processing tool of claim 26, wherein one of the grounding electrode and the dielectric covering overlaps the other of the grounding electrode and the dielectric covering.

28. The dual source plasma processing tool of claim 26, wherein the grounding electrode overlaps the dielectric covering.

29. The dual source plasma processing tool of claim 26, wherein the dielectric covering overlaps the grounding electrode.

30. The dual source plasma processing tool of claim 26, wherein the at least one grounding electrode comprises a plurality of grounding electrodes which are discretely positioned over the surface.

31. The dual source plasma processing tool of claim 26, wherein the dielectric covering comprises a plurality of dielectric coverings which are discretely positioned over the remaining portion of the surface area.

32. The dual source plasma processing tool of claim 26, wherein:
   the at least one grounding electrode comprises a plurality of grounding electrodes which are discretely positioned over the surface; and
   the dielectric covering comprises a plurality of dielectric coverings which are discretely positioned over the remaining portion of the surface area.

33. The dual source plasma processing tool of claim 26, wherein:
   the at least one grounding electrode comprises a set of grounding electrodes which are discretely positioned over the surface;
   the dielectric covering comprises a set of dielectric coverings which are discretely positioned over the remaining portion of the surface area; and
   one of the set of the grounding electrodes and the dielectric coverings are disposed over the other of the set of grounding electrodes and the dielectric coverings.

34. A dual source plasma processing tool comprising:
   a chamber having a surface area;
   a grounding node having an opening over a portion of the surface area; and
   a dielectric liner disposed over the surface area portion.

35. The dual source plasma processing tool of claim 34, wherein the grounding node has a plurality of openings over the surface area portion.

36. The dual source plasma processing tool of claim 34, where in:
   the grounding node has a plurality of openings over the surface area portion; and
   the dielectric covering comprises a plurality of dielectric coverings discretely positioned over the surface area portion corresponding to said plurality of openings.

37. The dual source plasma processing tool of claim 34, wherein the grounding node comprises a plurality of grounding node portions discretely positioned over the surface.

38. The dual source plasma processing tool of claim 34, wherein the grounding node comprises a portion intermediate the dielectric covering and the interior conductive groundable surface.

39. The dual source plasma processing tool of claim 34, wherein the dielectric covering comprises a plurality of dielectric covering portions received within the interior conductive groundable surface.

40. The dual source plasma processing tool of claim 34, wherein the grounding node comprises grounding node portions received over both the groundable surface and the dielectric covering.

41. A dual-source plasma etching method comprising:
   providing a dual-source plasma etching chamber having an interior base and an interior sidewall, at least a portion of the interior sidewall being grounded;
   providing a dielectric liner over only a portion of the interior sidewall of the chamber;
   grounding a portion of the interior sidewall not having the dielectric liner there over; and
   generating a plasma within the chamber, at least some of the plasma being disposed along the grounding path and in electrical contact with the grounded interior sidewall portion.

42. The dual-source plasma etching method of claim 41, wherein the grounding path comprises a hole which extends through the dielectric liner.

43. The dual-source plasma etching method of claim 41, wherein the grounding path comprises a plurality of holes which extend through the dielectric liner.

44. The dual-source plasma etching method of claim 43, wherein the dielectric liner is frusto-conical in shape.

45. A method of forming a plasma processing tool comprising:
   providing a processing chamber having an interior base and a conductive interior sidewall having at least a portion configured for grounding; and
   providing a dielectric liner over less than an entirety of the interior sidewall, the interior sidewall being sufficiently exposed through the dielectric liner to enable a grounding path to be established between the interior sidewall portion and a plasma which is to be generated within the chamber during processing.

46. The method of claim 45, wherein the providing of the dielectric liner comprises anodizing at least a portion of the interior sidewall sufficient to form a dielectric liner body.

47. The method of claim 46 further comprising after the anodizing of the interior sidewall, removing a portion of the dielectric liner body sufficient to provide a passageway for the grounding path.

48. The method of claim 46 further comprising after the anodizing of the interior sidewall, removing a portion of the dielectric liner body sufficient to provide a passageway for the grounding path, the passageway extending through and being surrounded by material of the dielectric liner.

49. The method of claim 45, wherein the providing of the dielectric liner comprises forming the liner to have a thickness of greater than about 5 mils.

50. The method of claim 45, wherein the providing of the dielectric liner comprises forming the liner to cover greater than about 10% of the surface area of the interior sidewall.

51. The method of claim 45, wherein the providing of the dielectric liner comprises forming a generally frustum-shaped dielectric liner.

52. The method of claim 45, wherein the providing of the dielectric liner comprises forming the dielectric liner to be removably mountable within the chamber, and to include a hole extending therethrough positioned to provide a passageway for the grounding path.

53. The method of claim 45, wherein the providing of the dielectric liner comprises forming the dielectric liner to be removably mountable within the chamber, and to include a plurality of holes extending therethrough positioned to provide passageways for the grounding path.

54. The method of claim 45, wherein the providing of the dielectric liner comprises removably mounting the dielectric liner within the chamber.

55. The method of claim 45, wherein the providing of the dielectric liner comprises forming a dielectric liner body away from the chamber, and removing a portion of the liner body sufficient to provide a passageway for the grounding path.

56. The method of claim 55, wherein the removing of the liner body portion comprises forming the passageway to extend through and be surrounded by material of the liner body.

57. The method of claim 45, wherein the providing of the dielectric liner comprises forming a dielectric liner body over the interior sidewall, and thereafter removing a portion of the dielectric liner body sufficient to provide a passageway for the grounding path.

58. The method of claim 57, wherein the removing of the liner body portion comprises forming the passageway to extend through and be surrounded by material of the liner body.

59. The method of claim 45, wherein the providing of the dielectric liner comprises forming the dielectric liner to have a plurality of holes therethrough proximate the interior sidewall portion.

60. The method of claim 59, wherein the forming of the dielectric liner comprises first forming a liner body over the interior sidewall, and then removing portions of the liner body sufficient to provide the holes.

61. A method of forming a plasma processing tool comprising:
   providing a chamber having an interior conductive groundable surface having an area;
   mounting at least one grounding electrode over and in operative contact with a first portion of the surface; and
   providing a dielectric covering disposed over a second portion of the surface area.

62. The method of claim 61, wherein the providing of the dielectric covering comprises forming the dielectric covering between a portion of the conductive groundable surface and a portion of the one grounding electrode.

63. A method of forming a plasma processing tool comprising:
   providing a chamber having an interior conductive groundable surface having a surface area;
   forming a grounding node disposed over and in operative contact with the surface, the grounding node having an opening over a portion of the surface area; and
   disposing a dielectric covering over the surface area portion.

64. The method of claim 63 further comprising forming said dielectric covering prior to forming said grounding node.

65. A plasma processing chamber comprising:
   a base;
   a conductive interior sidewall having an edge disposed adjacent the base, the sidewall having a surface area;
   a removable dielectric liner covering a portion of the surface area, the dielectric liner including a plurality of openings received therein and extending therethrough proximate the conductive interior sidewall, the dielectric covering comprising a generally frustum-shaped interior surface; and
   a grounding node formed on a portion of the surface area other than the portion covered by the liner.

66. The chamber of claim 65, wherein the dielectric liner comprises aluminum oxide.

67. The chamber of claim 65, further comprising:
   a first RF power source coupled to an interior of the chamber; and
   a second RF power source coupled to the support.

68. The chamber of claim 65, wherein the dielectric liner is mounted over at least an uppermost portion of the interior sidewall.

69. The chamber of claim 65, wherein the dielectric liner is mounted over at least a bottommost portion of the interior sidewall.

70. The chamber of claim 65, wherein the dielectric liner comprises an anodized layer of material.

71. A method of etching a wafer in a plasma etcher comprising:
   placing a wafer within a chamber having a base and conductive sidewalls;
   insulating a first portion of the sidewalls using a dielectric liner to cover the portion;
   grounding a second portion of the sidewalls that is not covered by the dielectric liner; and
   forming a plasma in the chamber.

72. The method of claim 71 wherein forming a plasma includes:
   coupling RF energy from a first RF power source to an interior of the chamber; and
   coupling RF energy from a second RF power source to the wafer support.

73. The method of claim 71 wherein insulating a first portion of the sidewalls includes insulating the first portion using a frusto-conical dielectric liner.

74. The method of claim 71, wherein insulating a first portion of the sidewalls comprises forming the dielectric liner to be removably mountable within the chamber, and to include a plurality of holes extending therethrough positioned to provide passageways for grounding the second portion.

75. The method of claim 71, wherein insulating a first portion of the sidewalls comprises removably mounting the dielectric liner within the chamber.

76. The method of claim 71, wherein insulating a first portion of the sidewalls comprises forming the dielectric liner away from the chamber, and removing a portion of the dielectric liner sufficient to provide a passageway for grounding the second portion.

* * * * *

UNITED STATES PATENT AND TRADEMARK OFFICE
CERTIFICATE OF CORRECTION

PATENT NO. : 6,184,146 B1
DATED : February 6, 2001
INVENTOR(S) : Kevin G. Donohoe and Guy T. Blalock It is certified that error appears in the above-identified patent and that said Letters Patent is hereby corrected as shown below:

Title Page,
Title, delete "producing" and insert --Processing-- and delete "Method of Forming" and insert -- Methods of Forming --.

Column 6,
Line 32, delete "For is example" and insert -- For example --.

Signed and Sealed this

Seventh Day of August, 2001

Attest:

NICHOLAS P. GODICI
Attesting Officer
Acting Director of the United States Patent and Trademark Office